(12) United States Patent
Lung et al.

(10) Patent No.: US 7,608,882 B2
(45) Date of Patent: Oct. 27, 2009

(54) SPLIT-GATE NON-VOLATILE MEMORY

(75) Inventors: Hsiang-Lan Lung, Hsinchu (TW);
Rui-Chen Liu, Hsinchu (TW)

(73) Assignee: MACRONIX International Co., Ltd.,
Hsinchu (TW)

( * ) Notice: Subject to any disclaimer, the term of this patent is extended or adjusted under 35 U.S.C. 154(b) by 0 days.

(21) Appl. No.: 10/604,692

(22) Filed: Aug. 11, 2003

(65) Prior Publication Data

US 2005/0035393 A1    Feb. 17, 2005

(51) Int. Cl.
*H01L 29/788* (2006.01)
(52) U.S. Cl. .................. 257/315; 257/314; 257/320; 257/324; 257/E29.309
(58) Field of Classification Search ......... 257/314–316, 257/319, E27.099, E29.04, 320, 324, E29.309
See application file for complete search history.

(56) References Cited

U.S. PATENT DOCUMENTS

| | | | | |
|---|---|---|---|---|
| 4,257,832 A | * | 3/1981 | Schwabe et al. ............ 438/275 |
| 5,242,848 A | * | 9/1993 | Yeh ............................. 438/266 |
| 5,714,412 A | * | 2/1998 | Liang et al. .................. 438/266 |
| 6,093,945 A | * | 7/2000 | Yang ........................... 257/317 |
| 6,111,788 A | * | 8/2000 | Chen et al. ............. 365/185.18 |
| 6,335,554 B1 | * | 1/2002 | Yoshikawa ................... 257/316 |
| 6,580,120 B2 | * | 6/2003 | Haspeslagh ................. 257/315 |
| 6,862,223 B1 | * | 3/2005 | Lee et al. ................ 365/185.33 |
| 6,888,755 B2 | * | 5/2005 | Harari ..................... 365/185.18 |
| 6,894,344 B2 | * | 5/2005 | Kamigaki et al. ............ 257/324 |
| 7,151,293 B1 | * | 12/2006 | Shiraiwa et al. ............. 257/314 |

\* cited by examiner

*Primary Examiner*—Matthew E Warren
(74) *Attorney, Agent, or Firm*—Jianq Chyun IP Office

(57) ABSTRACT

A split-gate non-volatile memory cell is described, including a substrate, a charge-trapping layer on the substrate, a split gate on the charge-trapping layer, and a source/drain in the substrate beside the split gate. The split gate includes at least one split region directly over the charge-trapping layer, and the charge-trapping layer around the split region serves as a coding region. A NAND non-volatile memory array is also described including the above-mentioned split-gate non-volatile memory cells that are arranged in a NAND-type configuration.

12 Claims, 3 Drawing Sheets

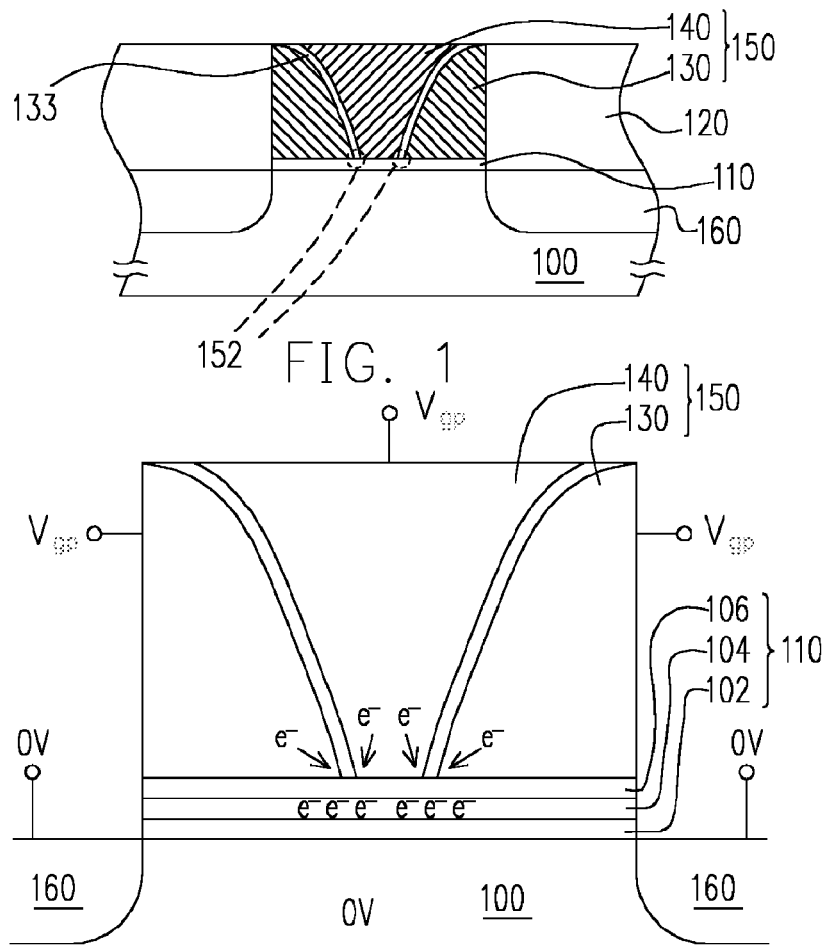
FIG. 1
FIG. 2A
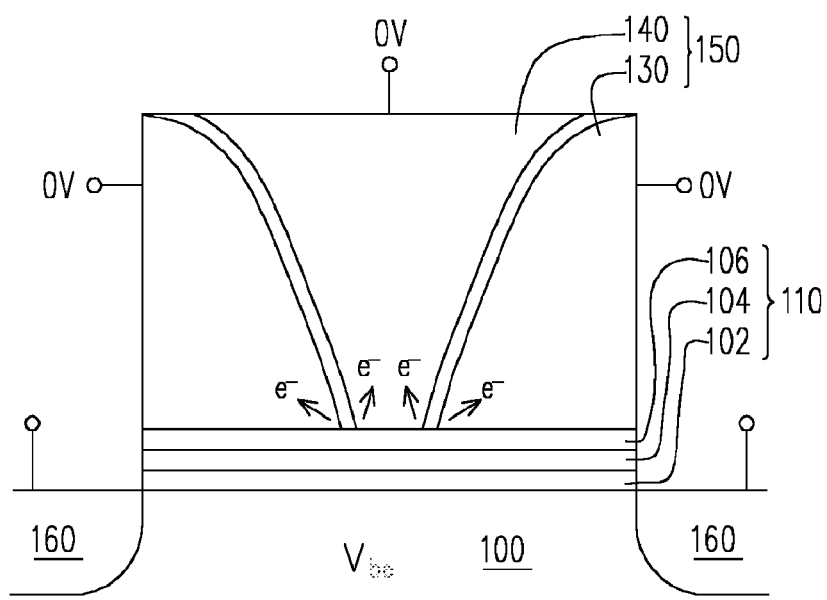
FIG. 2B

SPLIT-GATE NON-VOLATILE MEMORY

BACKGROUND OF INVENTION

1. Field of Invention

The present invention relates to a semiconductor device. More particularly, the present invention relates to structures of a split-gate non-volatile memory cell and a split-gate non-volatile memory array, and the methods for operating the same.

2. Description of Related Art

In the family of non-volatile memory devices, various electrically erasable programmable memory ($E^2$PROM/Flash EPROM) devices have been widely used in personal computers and electronic apparatuses since they can be programmed and erased repeatedly, and can retain data even if disconnected from electrical power. A conventional $E^2$PROM/Flash EPROM device has a stacked gate structure consisting of a floating gate for storing carriers and a control gate that is separated from the floating gate by a dielectric layer. For example, U.S. Pat. No. 5,479,368 discloses a flash memory cell structure that has two spacer floating gates under a control gate, and U.S. Pat. No. 5,051,793 discloses another flash memory cell structure that has a spacer floating gate surrounding a control gate.

Recently, however, a new category of $E^2$PROM/Flash EPROM devices utilizing charge-trapping mechanism are provided to avoid the leakage problem of the conventional $E^2$PROM/Flash EPROM devices. A trapping-type $E^2$PROM/Flash EPROM usually includes a composite ONO charge-trapping layer disposed between a substrate and a silicon gate, and is therefore called a "SONOS memory". For example, U.S. Pat. No. 5,966,603 discloses a SONOS memory that stores two bits per cell (2 bits/cell). The SONOS memory is programmed with channel hot electrons and erased with hot holes, wherein hot electrons or hot holes are injected into two coding regions in the charge-trapping layer near the source/drain of a memory cell. In addition, U.S. Pat. Nos. 5,789,776 and 5,774,400 both disclose a SONOS memory cell structure that has a polysilicon gate connected to an upper metal line.

To operate a SONOS memory, however, relatively high voltages from 15V to 18V are required for injecting carriers into or ejecting carriers from the nitride trapping layer since the energy barrier of the bottom oxide layer is quite high ($\approx 9$ eV for electrons). Therefore, the power consumption of the conventional SONOS memory device is high, and the circuit design is difficult. For example, some devices in the periphery circuit have to be specially designed to fit with the high voltages, and more voltage-boosting circuit units may be required to achieve the high voltages starting from a relatively low input voltage. In view of this, lowering the required operating voltages is an important issue in the design of trapping-type $E^2$PROM/Flash EPROM devices.

SUMMARY OF INVENTION

Accordingly, this invention provides a split-gate non-volatile memory cell that allows low-voltage operations.

This invention also provides a split-gate non-volatile memory array based on the split-gate non-volatile memory cell of this invention.

This invention further provides a word line structure that can be adopted in the non-volatile memory array of this invention. The word line structure allows separate pieces of a split gate to be electrically connected to the same voltage source.

This invention also provides a method for operating a split-gate non-volatile memory cell of this invention.

This invention further provides a method for operating the split-gate non-volatile memory array of this invention.

The split-gate non-volatile memory cell of this invention comprises a substrate, a charge-trapping layer on the substrate, a split gate on the charge-trapping layer, and a source/drain in the substrate beside the split gate. The split gate includes at least one split region directly over the charge-trapping layer that defines a pair of opposite edge portions, and the charge-trapping layer around the split region serves as a coding region.

The split-gate non-volatile memory array of this invention comprises at least the split-gate non-volatile memory cells of this invention, and the accompanying word lines and bit lines for controlling the split-gate non-volatile memory cells. The non-volatile memory array can be a NAND-type, NOR-type or AND-type memory array.

A word line in the split-gate non-volatile memory array of this invention may include a boundary conductor at a boundary of the memory array and a split-gate line crossing the array region that has at least two separate linear conductors. The two linear conductors consists of a first and a second linear conductors separated by a dielectric layer, wherein the second linear conductor is completely or partially covered by the first linear conductor, and is directly connected with the boundary conductor. The first linear conductor and the boundary conductor are also separated by the dielectric layer, but are simultaneously connected with an upper contact. With the boundary conductor directly connected with the second linear conductor, the first and the second linear conductors can be connected to the same voltage source via a contact.

An embodiment of the split-gate non-volatile memory array of this invention is a NAND (NOT AND) non-volatile memory array. The NAND non-volatile memory array includes plural split-gate non-volatile memory cells of this invention on the substrate, word lines, bit lines and source regions. Each memory cell includes a charge-trapping layer and a split gate thereon, and shares a diffusion with an adjacent memory cell in the same row. The split gate includes at least one split region directly over the charge-trapping layer, and the charge-trapping layer around the split region serves as a coding region. In a column of memory cells, the split gate of each memory cell is coupled to the same word line. In a row of memory cells, a diffusion of one terminal memory cell is coupled to a bit line, and a diffusion of the other terminal memory cell is coupled to a source region.

A method for operating a split-gate non-volatile memory cell of this invention is described below. In a programming operation, the split gate is applied with a first negative voltage, and the source/drain and the substrate are applied with 0V. The first negative voltage is sufficiently high for injecting electrons into the coding region via the edge portions of the split gate. In an erasing operation, the substrate is applied with a second negative voltage, the split gate is applied with 0V, and the source/drain is floated. The second negative voltage is sufficiently high for ejecting electrons from the coding region.

A method for operating a NAND non-volatile memory array of this invention is described below. In a programming operation, the selected word line coupled to the selected memory cell is applied with a first negative voltage, the unselected word lines are applied with a first positive voltage to turn on the unselected memory cells. The selected bit line coupled to the selected memory cell, the substrate and the source are applied with 0V. The unselected bit lines are applied with a second negative voltage to inhibit programming of the unselected memory cells that are coupled to the selected word line together with the selected memory cell. The first negative voltage is sufficiently high for injecting electrons into the charge-trapping layer of the select memory cell. In an erasing operation, the substrate are applied with a third negative voltage, the word lines are applied with 0V, and the bit lines and the source are floated. The third negative voltage is sufficiently high for ejecting electrons from the charge-trapping layers of the memory cells.

As mentioned above, a split gate including at least one split region is disposed on the charge-trapping layer in the non-volatile memory cell of this invention. Since a stronger electric field can be established between the p-well and the edge portions of the separate pieces of the split gate, the voltages for programming and erasing the non-volatile memory cell are lower than those for programming and erasing a conventional NROM device. Therefore, the power consumption of the split-gate non-volatile memory device of this invention is lower, and the circuit design is easier.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 illustrates a cross-sectional view of a split-gate non-volatile memory cell according to a preferred embodiment of this invention.

FIGS. 2A and 2B illustrate a programming operation and an erasing operation, respectively, of the split-gate non-volatile memory cell illustrated in FIG. 1.

DETAILED DESCRIPTION

Figure 3:
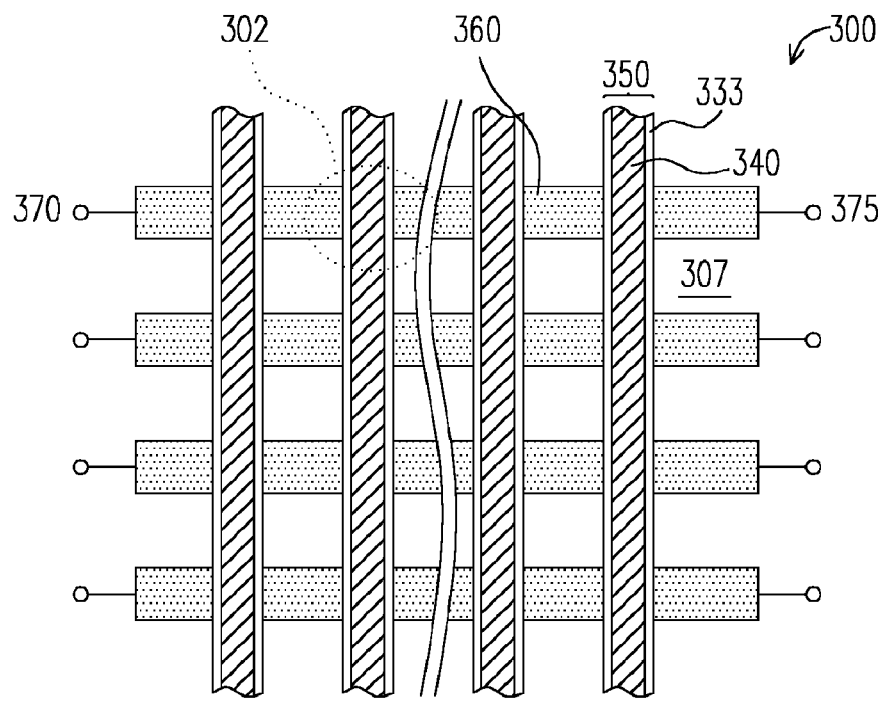
FIG. 3 illustrates a layout of a NAND non-volatile memory array according to the preferred embodiment of this invention.

Split-Gate Non-Volatile Memory Cell: FIG. 1 illustrates a cross-sectional view of a split-gate non-volatile memory cell according to a preferred embodiment of this invention.

Referring to FIG. 1, the split-gate non-volatile memory cell of this invention includes a substrate 100, a charge-trapping layer 110 on the substrate 100, an insulator 120 beside the charge-trapping layer 110, a split gate 150 on the charge-trapping layer 110, and a source/drain 160 in the substrate 100 beside the split gate 150. The substrate 100 is, for example, a p-substrate or a p-well formed in an n-substrate. The charge-trapping layer 110 includes, for example, an ONO (oxide/nitride/oxide) composite layer or an aluminum oxide ($Al_2O_3$) layer. The insulator 120 is disposed on the source/drain 160, and comprises a material such as BPSG (boron phosphorous silicate glass). The split gate 150 includes a pair of conductive spacers 130, and a conductive layer 140 between the two conductive spacers 130 but separated from the latter by a dielectric layer 133. The conductive spacers 130 are disposed on the sidewalls of the insulator 120, so the non-vertical sidewall of each conductive spacer 130 faces the conductive layer 140. The conductive layer 140 has a top portion almost completely covering the two conductive spacers 130. The conductive layer 140 and the two conductive spacers 130 comprise a material such as polysilicon. The dielectric layer 133 comprises a material such as silicon oxide, and may be formed with thermal oxidation. The source/drain 160 is, for example, an n+ doped region formed in a p-substrate 100.

A shown in FIG. 1, the split gate 150 includes two split regions 152 between the conductive layer 140 and the two conductive spacers 130 and right over the charge-trapping layer 110. Thus, totally two pairs of edge portions are defined in the conductive layer 140 and the two conductive spacers 130 right over the charge-trapping layer 110. Since an edge portion can create a larger electric field with the same voltage difference as compared with a conventional planar gate layer, carriers are injected into or ejected from the charge-trapping layer via the edge portions, and the operation voltages required for programming or erasing can be lowered.

Operating Method of Split-Gate Non-Volatile Memory Cell: FIGS. 2A and 2B illustrate a programming operation and an erasing operation, respectively, of the split-gate non-volatile memory cell in FIG. 1, wherein the charge-trapping layer 110 consists of a bottom oxide layer 102, a silicon nitride layer 104 for trapping carriers, and a top oxide layer 106.

Refer to FIG. 2A for understanding the programming operation. The split gate 150, including the two conductive spacers 130 and the conductive layer 140, is applied with a negative voltage $V_{gp}$, such as 10V. The p-substrate 100 and the n+-source/drain 160 are applied with 0V. Since the electric field at the internal edge portions of the two conductive spacers 130 and the conductive layer 140 is stronger, electrons are injected into the charge-trapping layer 110 via the edge portions and trapped in the silicon nitride layer 104. The two conductive spacers 130 and the conductive layer 140 may be biased via the same contact (not shown), which will be explained later.

With the injected electrons in the silicon nitride layer 104, the threshold voltage of the split-gate non-volatile memory cell is raised. Thus, by applying a voltage between the threshold voltage of the written state and that of the erased state to the split gate 150 in a reading operation, the state (data) of the memory cell can be easily identified.

Referring to FIG. 2B, in the erasing operation, the p-substrate 100 is applied with a negative voltage $V_{be}$, such as 10V. The split gate 150, including the two conductive spacers 130 and the conductive layer 140, is applied with 0V, and the source/drain 160 is floated. Since the electric field under the internal edge portions of the two conductive spacers 130 and the conductive layer 140 is stronger, electrons are ejected from the silicon nitride layer 104 of the charge-trapping layer 110 via the edge portions. The two conductive spacers 130 and the conductive layer 140 may be biased via the same contact (not shown), which will be explained later.

Figure 4:
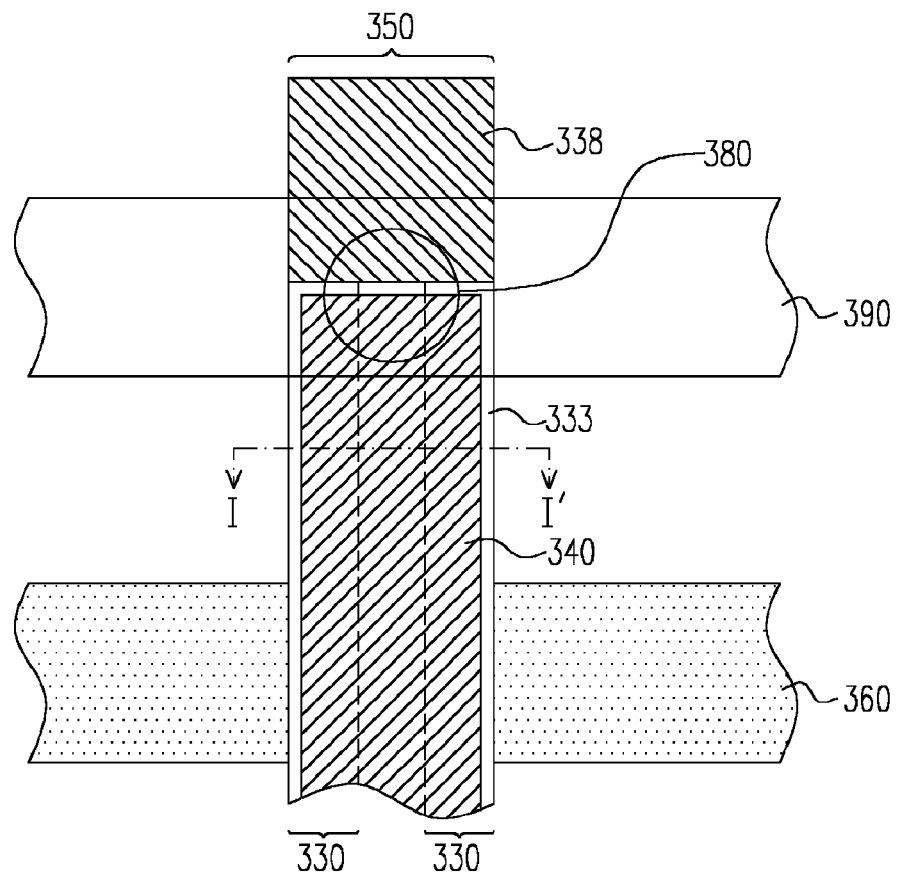
FIG. 4 illustrates a word line structure at the boundary of the NAND-type non-volatile memory array illustrated in FIG. 3 according to the preferred embodiment of this invention.

NAND Non-Volatile Memory Array: FIG. 3 illustrates a layout of a NAND non-volatile memory array according to the preferred embodiment of this invention. FIG. 4 illustrates a word line structure at the boundary of the NAND non-volatile memory array illustrated in FIG. 3.

Referring to FIG. 3, the NAND non-volatile memory array 300 includes a substrate (not shown), shallow trench isolation (STI) layers 307 in the substrate, word lines 350 crossing over the STI layers 307, charge-trapping layers (not shown) between the word lines 350 and the substrate, and diffusions 360 in the substrate between the word lines 350 and between the STI layers 307. In the memory array 300, a memory cell 302 includes two diffusions 360 and the charge-trapping layer and the word line 350 between the two diffusions 360. A diffusion of one terminal memory cell in a row of memory cells 302 is coupled to a bit line 370, and a diffusion of the other terminal memory cell 302 in the same row is coupled to a source 375.

Referring to FIG. 4, each word line 350 comprises a boundary conductor 338, a pair of linear conductive spacers 330, and a linear conductor 340 between the two linear conductive spacers 330, wherein the non-vertical sidewall of each linear conductive spacer 330 faces the linear conductor 340. The two linear conductive spacers 330 are directly connected with the boundary conductor 338, and the linear conductor 340 is separated from the boundary conductor 338 and the two linear conductive spacers 330 by a dielectric layer 333. The boundary conductor 338 and the linear conductor 340 are electrically connected to an operating line 390 via a contact 380 that has one portion on the boundary conductor 338 and the other portion on the linear conductor 340. In addition, the cross-sectional view of the two linear conductive spacers 330, the dielectric layer 333 and the linear conductor 340 along line I-I" is the same as that illustrated in FIG. 1, wherein the reference characters 330, 333 and 340 correspond to 130, 133 and 140, respectively. Moreover, the charge-trapping layer under the word line 350 is not shown in FIG. 4. With the boundary conductor 338 directly connected with the two linear conductive spacers 330, the two linear conductive spacers 330 and the linear conductor 340 that are separated by the dielectric layer 333 can be connected to the same voltage source via the contact 380.

In the aforementioned word line structure, the boundary conductor 338, the two linear conductive spacers 330 and the linear conductor 340 preferably comprises polysilicon, and the dielectric layer comprises a material such as thermal oxide. On the other hand, the contact 380 and the operating line 390 may be made from metal.

Figure 5:
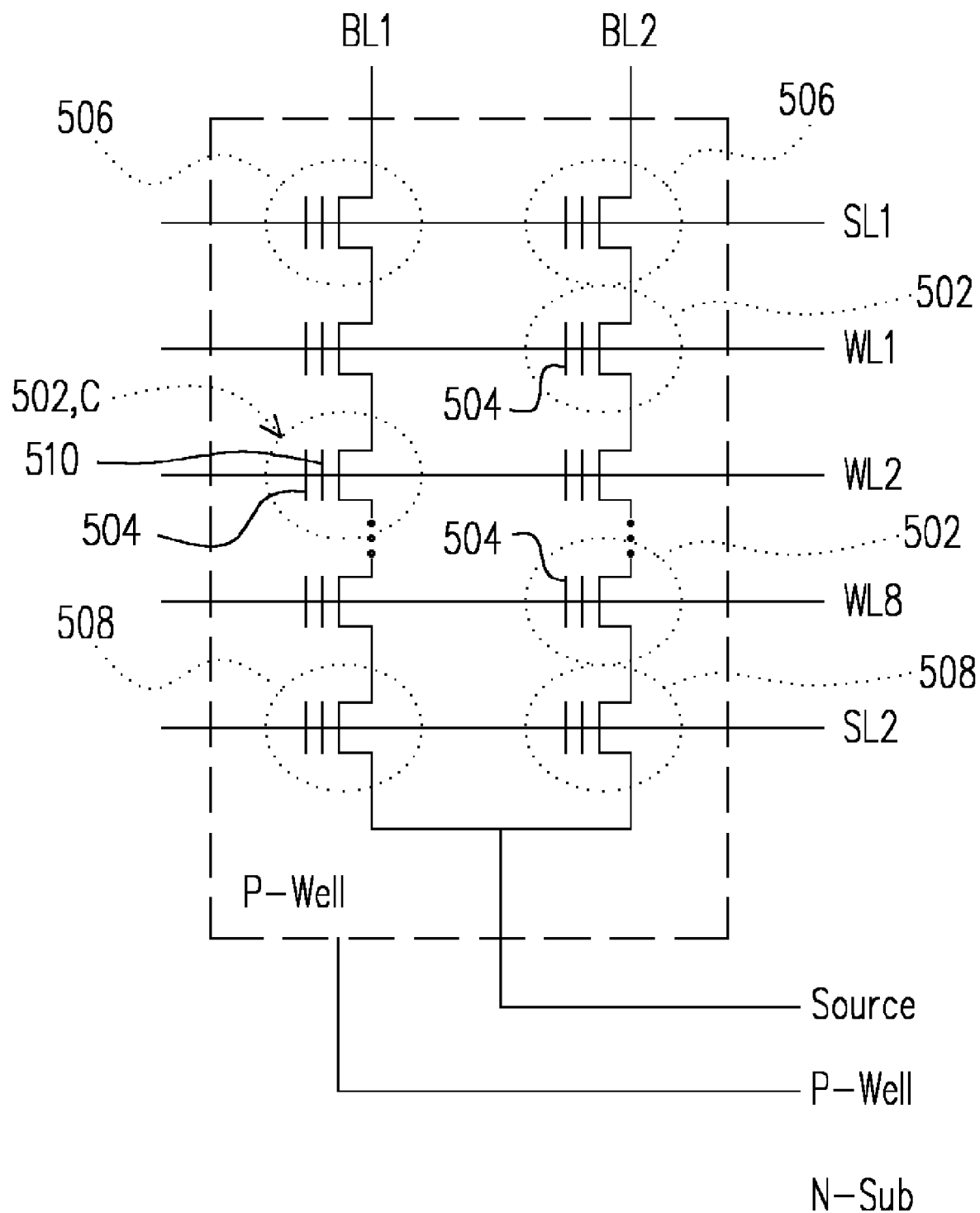
FIG. 5 illustrates a circuit diagram of a NAND non-volatile memory array according to another preferred embodiment of this invention.

FIG. 5 illustrates a circuit diagram of a NAND non-volatile memory array according to another preferred embodiment of this invention.

Referring to FIG. 5, the NAND non-volatile memory array 500 includes an n-substrate (N-Sub), a p-well in the n-substrate, memory cells 502, word lines (WL), bit lines (BL), a source, select transistors 506 and 508, and select lines (SL). Each memory cell 502 has a split-gate 504 and a charge-trapping layer 510 disposed as described above. The memory cells 502 in one row are coupled to one word line via their split-gates 504, and those in one column coupled to one bit line. The memory cells 502 are partitioned with 8×2 (row× column) cells as a unit, wherein one terminal memory cell in a column of memory cells 502 is coupled to a bit line via a select transistor 506, and the other terminal memory cell 502 in the same column to the source via a select transistor 508. The two columns of memory cells in FIG. 5 share a source. The select transistor 506 coupled to the bit line BL1 and the select transistor 508 in the same column coupled to the source are used to select the unit from all of the units aligned along and coupled to BL1.

Operating Method of NAND Non-Volatile Memory Array: The operating method of the aforementioned NAND non-volatile memory array of this invention, especially the programming operation and the erasing operation, are described below with a selected memory cell C in the NAND non-volatile memory array 500 illustrated in FIG. 5 as an example. The exemplary bias configurations for programming, erasing and reading, respectively, are listed in Table 1.

TABLE 1

|  | Program | Erase | Read |
|---|---|---|---|
| BL1 (Selected) | 0 V | Floated | 1 V |
| BL2 (Unselected) | −4 V | Floated | 0 V |
| WL2 (Selected) | −10 V | 0 V | 0 V |
| WL1, 3-8 (Unselected) | 3 V | 0 V | 3 V |
| SL1 | 10 V | −10 V | 3 V |
| SL2 | 0 V | −10 V | 3 V |
| Source | 0 V | Floated | 0 V |
| P-Well | 0 V | −10 V | 0 V |
| N-Substrate (N-Sub) | 0 V | −10 V | 0 V |

Referring to Table 1 and FIG. 5 for understanding the programming operation. The selected word line WL2 coupled to the split gate 504 of the selected memory cell C is applied with a first negative voltage, such as 10V. The unselected word lines WL1, 3-8 are applied with a first positive voltage, such as 3V, to turn on the unselected memory cells 502 in the same unit. The selected bit line BL1 coupled to the selected memory cell C, the n-substrate and the p-well are applied with 0V, and the unselected bit line BL2 coupled to the other column of memory cells in the same unit is applied with a second negative voltage, such as 4V. The select line SL1 is applied with a positive voltage, such as 10V, to turn on the two select transistors 506 in the same unit in order to select the unit, i.e., to establish an electrical connection between the unit and the two bit lines BL1 and BL2.

Since only the voltage difference between the p-well and the split gate 504 of the selected memory cell C is sufficiently high (10V), the charge-trapping layer 510 of the selected memory cell C is selectively injected with electrons, i.e., selectively programmed. The voltage difference between the p-well and the split gates 504 of the unselected memory cells is merely 3V, which is insufficient for electron injection. Meanwhile, the second negative voltage (4V) applied to the unselected bit line BL2 has an effect of lowering the local potential of the p-well under the other column of memory cells 502, so that the voltage difference between the split gate 504 of the unselected memory cell 502 coupled to the selected word line WL2 is not sufficiently large for electron injection.

In the above programming operation, the negative voltage (10V) applied to the selected word line WL2/split gate 504 is lower than that applied to a conventional NROM device since a stronger electric field can be established between the edge portions of the split gate 504 and the p-well with the same voltage difference.

Referring to Table 1 and FIG. 5 again for understanding the reading operation. The selected word line WL2 coupled to the split gate 504 of the selected memory cell C is applied with 0V. The unselected word lines WL1, 3-8 are applied with a positive voltage higher than the threshold voltage of the written state, such as 3V, to turn on the unselected memory cells 502 in the same unit. The selected bit line BL1 is applied with a low voltage, such as 1V, and the unselected bit line BL2, the n-substrate, the p-well and the source with 0V. The select lines SL1 and SL2 are applied with a positive voltage, such as 3V, to turn on the select transistors 506 and 508 in order to select the unit, i.e., to establish an electrical connection between the unit and the bit lines BL1 and BL2. Since a voltage difference exists between the selected line BL1 and the source, and the unselected memory cells are all turned on, the magnitude of the current flowing through the unit is dependent on the state of the selected memory cell C. If electrons are present in the its charge-trapping layer 510, the current is extremely small; if electrons are absent, a current of several magnitudes larger can be measured. Therefore, by measuring the electric current flowing through the unit, the state/data (0 or 1) of the memory cell can be identified.

Referring to Table 1 and FIG. 5 again for understanding the erasing operation. The word lines WL1-8 are applied with 0V, the n-substrate and the p-well both are applied with a negative voltage, such as 10V, and the bit lines BL1 and BL2 and the source are all floated. The select lines SL1 and SL2 are applied with a negative voltage comparable to that applied to the p-well, such as 10V. With the voltage difference (10V) between the p-well and the split gates 504 of all memory cells 502, the electrons trapped in the charge-trapping layers 510 of them are ejected via the edge portions of the split gates 504. The negative voltage (10V) for erasing the non-volatile memory of this invention is lower than that for erasing a conventional NROM device since a stronger electric field can be established between the edge portions of the split gates 504 and the p-well with the same voltage difference.

According to the aforementioned, the voltages for programming and erasing the split-gate non-volatile memory of this invention is lower than that for a conventional NROM device since a stronger electric field can be established between the edge portions of the split gate and the p-well. Therefore, the power consumption of the split-gate non-volatile memory device of this invention is lower, and the circuit design is easier.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A split-gate non-volatile memory cell, comprising:
    a substrate;
    a charge-trapping layer on the substrate;
    a split gate as a whole located over the charge-trapping layer, being a part of one word line of a non-volatile memory array including the split-gate non-volatile memory cell; and
    a source/drain in the substrate beside the split gate,
    wherein the split gate includes at least two neighboring conductive pieces that are shorted with each other and have two opposite edge portions together causing, in operation of the memory cell, a locally stronger electric field such that only one coding region is defined, by the two neighboring conductive pieces, in the charge-trapping layer around the two opposite edge portions.

2. The split-gate non-volatile memory cell of claim 1, wherein the conductive pieces of the split gate include a pair of conductive spacers and a conductive layer between the pair of conductive spacers.

3. The split-gate non-volatile memory cell of claim 2, wherein the pair of conductive spacers are arranged with two substantially vertical sidewalls thereof adjacent to the source/drain.

4. The split-gate non-volatile memory cell of claim 3, further comprising an insulator on the source/drain, wherein the pair of conductive spacers are disposed on the sidewalls of the insulator.

5. The split-gate non-volatile memory cell of claim 1, wherein the conductive pieces are separated from each other by a dielectric layer.

6. The split-gate non-volatile memory cell of claim 1, wherein the split gate comprises polysilicon.

7. The split-gate non-volatile memory cell of claim 1, wherein the charge-trapping layer comprises a silicon nitride layer disposed between two silicon oxide layers.

8. The split-gate non-volatile memory cell of claim 1, wherein the charge-trapping layer comprises aluminum oxide ($Al_2O_3$).

9. The split-gate non-volatile memory cell of claim 1, wherein the substrate comprises a p-substrate, and the source/drain comprises an n-type source/drain.

10. An operating method of a split-gate non-volatile memory cell, wherein
    the split-gate non-volatile memory cell comprises:
        a substrate;
        a charge-trapping layer on the substrate;
        a split gate as a whole located over the charge-trapping layer, being a part of one word line of a non-volatile memory array including the split-gate non-volatile memory cell; and
        a source/drain in the substrate beside the split gate,
        wherein the split gate includes at least two neighboring conductive pieces that are shorted with each other and have two opposite edge portions together causing, in operation of the memory cell, a locally stronger electric field such that only one coding region is defined, by the two neighboring conductive pieces, in the charge-trapping layer around the two opposite edge portions;
    and the operating method comprises:
        in a programming operation:
        applying 0V to the substrate and the source/drain; and
        applying a first negative voltage to the split gate, the first negative voltage being sufficiently high for injecting electrons into the coding region; and
        in an erasing operation:
        applying 0V to the split gate, wherein each conductive piece is at an electric state of 0 V;
        floating the source/drain; and
        applying a second negative voltage to the substrate, the second negative voltage being sufficiently high for ejecting electrons from the coding region.

11. The operating method of claim 10, wherein the first negative voltage is about −10V.

12. The operating method of claim 10, wherein the second negative voltage is about −10V.

* * * * *